US008963098B2

(12) United States Patent
Lohse et al.

(10) Patent No.: US 8,963,098 B2
(45) Date of Patent: Feb. 24, 2015

(54) DIRECT CONVERSION X-RAY DETECTOR WITH RADIATION PROTECTION FOR ELECTRONICS

(75) Inventors: Thomas Lohse, Dresden (DE); Peter Krueger, Dresden (DE); Martin Oppermann, Dresden (DE); Thomas Zerna, Dresden (DE); Oliver Albrecht, Dresden (DE); René Metasch, Dresden (DE); Annika Oettl, Kassel (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 279 days.

(21) Appl. No.: 13/559,713

(22) Filed: Jul. 27, 2012

(65) Prior Publication Data

US 2013/0026379 A1  Jan. 31, 2013

(30) Foreign Application Priority Data

Jul. 28, 2011  (DE) .......................... 10 2011 108 876

(51) Int. Cl.
*G01T 1/24* (2006.01)
*H01L 25/16* (2006.01)
*H04N 5/32* (2006.01)
*H01L 27/146* (2006.01)

(52) U.S. Cl.
CPC ............... *H01L 25/167* (2013.01); *H04N 5/32* (2013.01); *H01L 27/14618* (2013.01); *H01L 27/14661* (2013.01); *G01T 1/24* (2013.01); *H01L 2224/48091* (2013.01); *H01L 2224/73257* (2013.01); *H01L 2224/49175* (2013.01)
USPC .................. 250/370.12; 250/252.1

(58) Field of Classification Search
CPC ......................................................... G01T 1/24
USPC ............................................. 250/252, 370.12
See application file for complete search history.

(56) References Cited

U.S. PATENT DOCUMENTS

| 2002/0003168 A1* | 1/2002 | Takabayashi ................. 235/492 |
| 2002/0023501 A1* | 2/2002 | Krumpolz et al. .............. 73/722 |

(Continued)

FOREIGN PATENT DOCUMENTS

| DE | 4019613 A1 * | 1/1992 |
| DE | 19711927 A1 | 9/1998 |

(Continued)

*Primary Examiner* — David Porta
*Assistant Examiner* — Abra Fein
(74) *Attorney, Agent, or Firm* — Schwegman Lundberg & Woessner, P.A.

(57) ABSTRACT

The present invention relates to an X-ray detector having an X-ray sensor (first X-ray sensor) converting X-radiation directly into electric charge carriers, having signal evaluation electronics electrically connected to the X-ray sensor and preferably formed as integrated circuit(s), having an X-ray absorber formed for protecting the signal evaluation electronics, and having a sensor carrier (first sensor carrier) formed and arranged for positioning the X-ray sensor relative to the X-ray absorber, wherein, viewed in the direction of incidence of the X-radiation, both the signal evaluation electronics are arranged behind the X-ray absorber and in the X-radiation shadow thereof and the X-ray sensor is admittedly likewise positioned by means of the sensor carrier preferably arranged between the X-ray absorber and the signal evaluation electronics at least sectionally behind the X-ray absorber, but outside the X-radiation shadow thereof.

11 Claims, 11 Drawing Sheets

(56) References Cited

U.S. PATENT DOCUMENTS

2006/0076483 A1* 4/2006 Scheidemann et al. ....... 250/289
2008/0134793 A1* 6/2008 Woychik et al. ................ 73/649
2008/0258067 A1* 10/2008 Vogtmeier et al. ....... 250/370.09
2009/0007626 A1* 1/2009 Bochen et al. ................ 73/1.68

FOREIGN PATENT DOCUMENTS

| DE | 102007010639 A1 | 9/2008 |
|----|-----------------|--------|
| DE | 102009008702 A1 | 8/2010 |

* cited by examiner

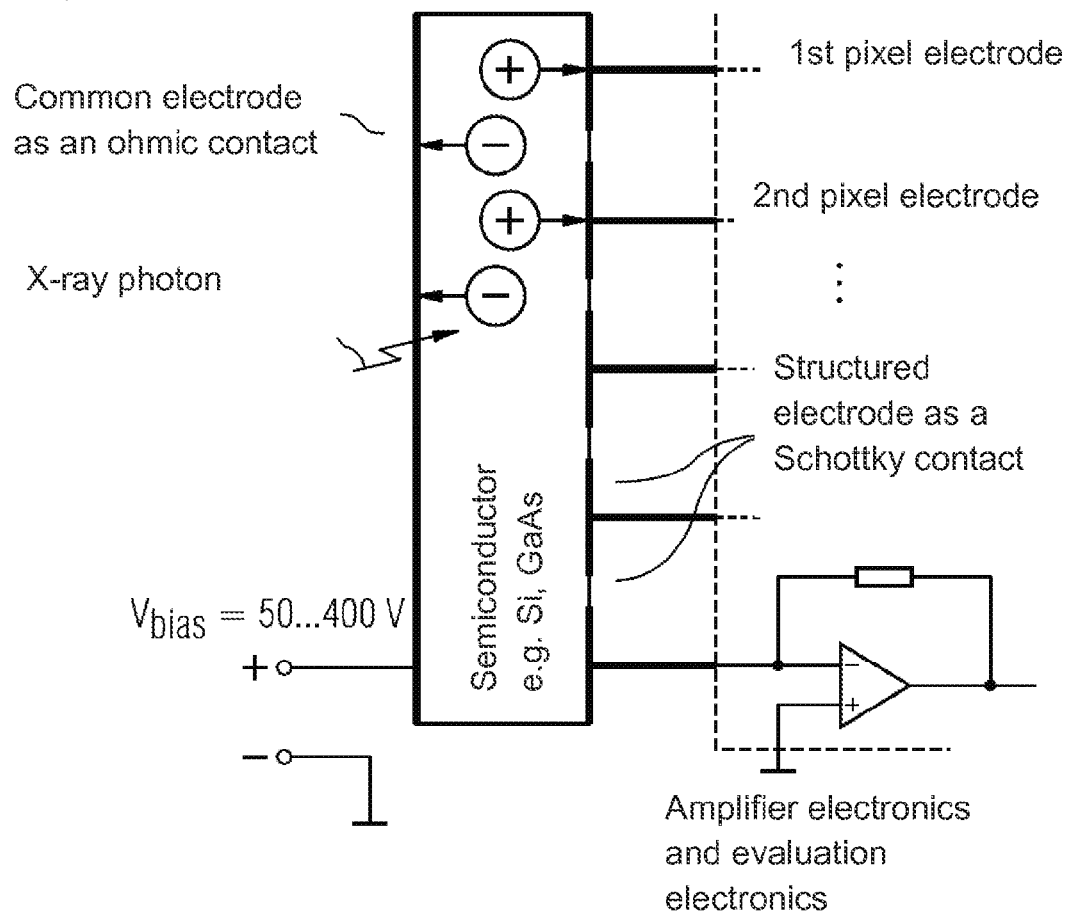

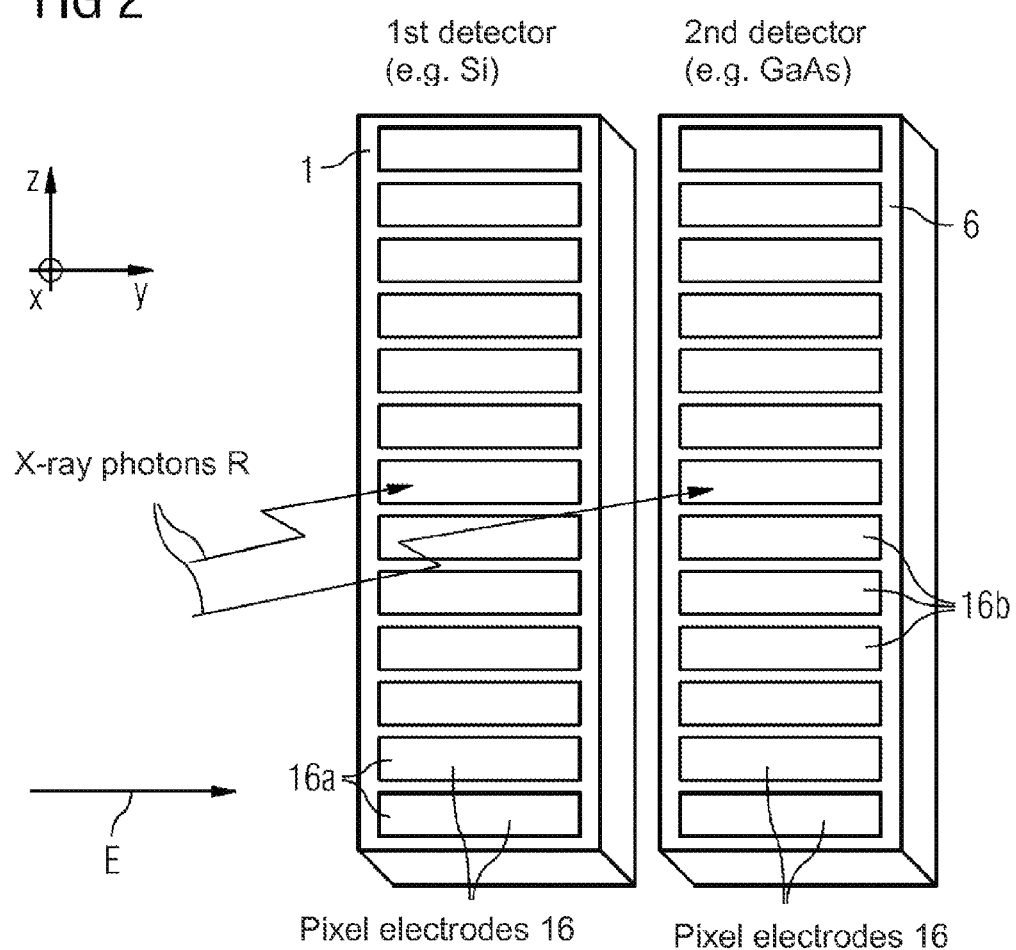

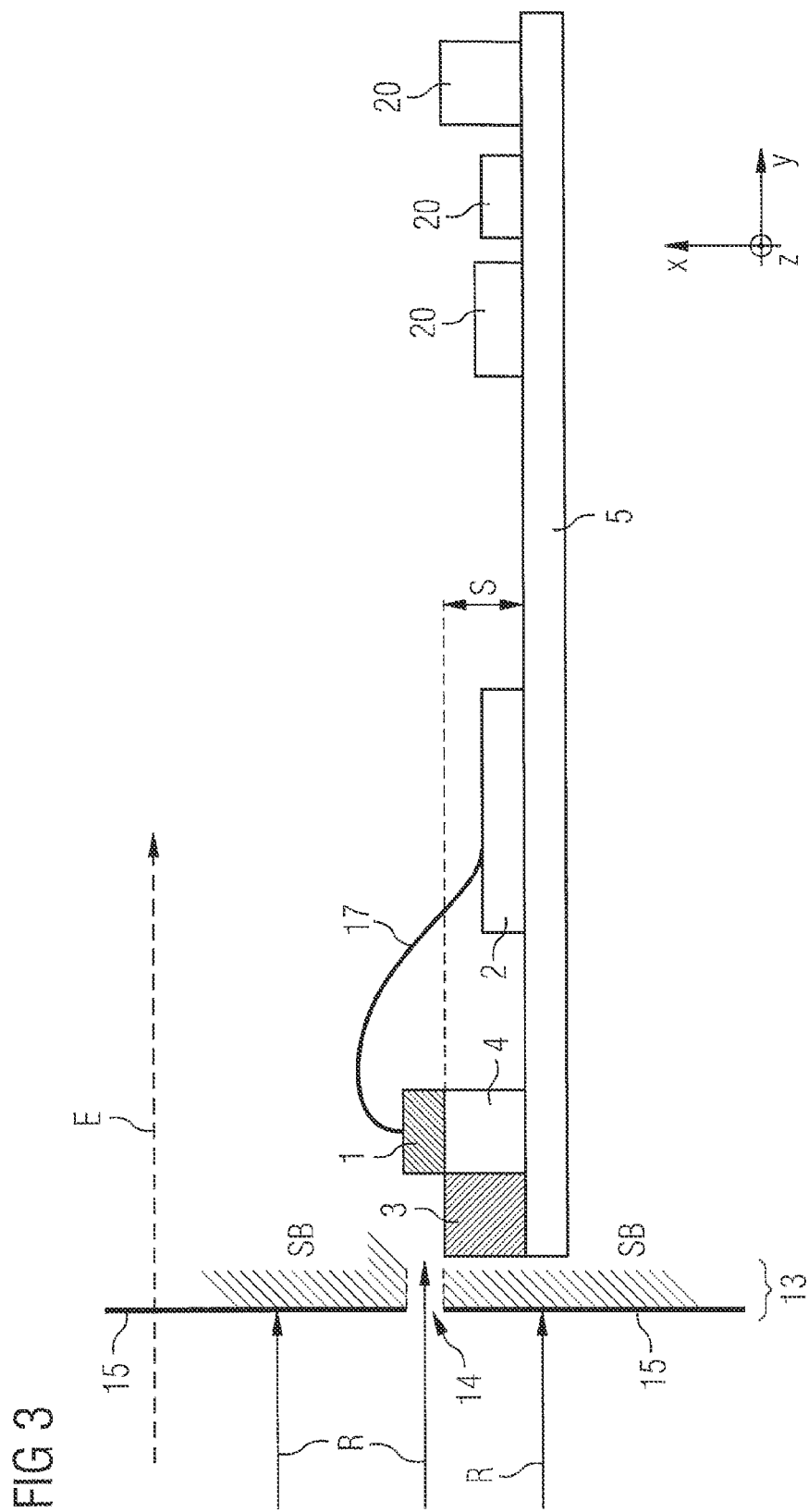

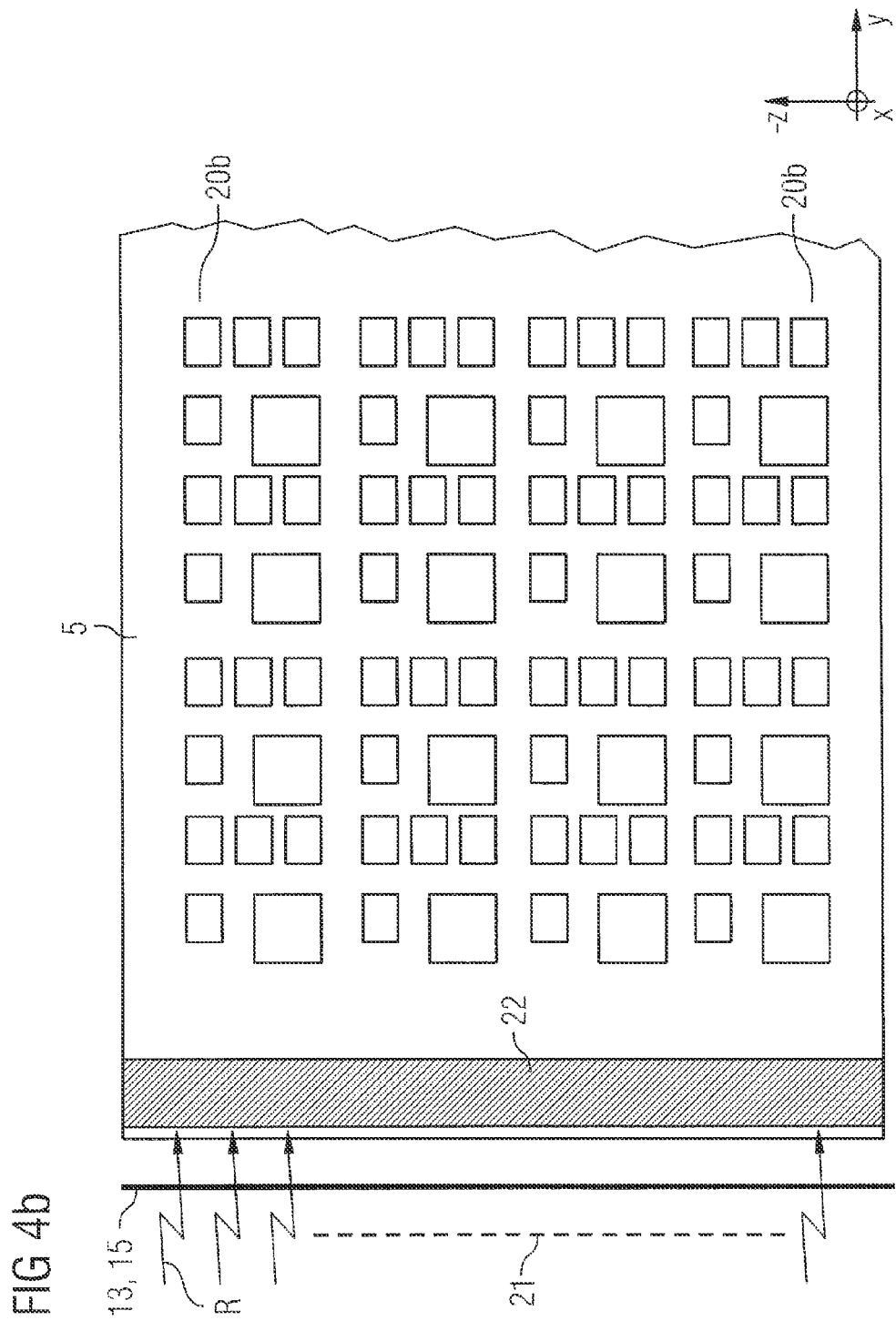

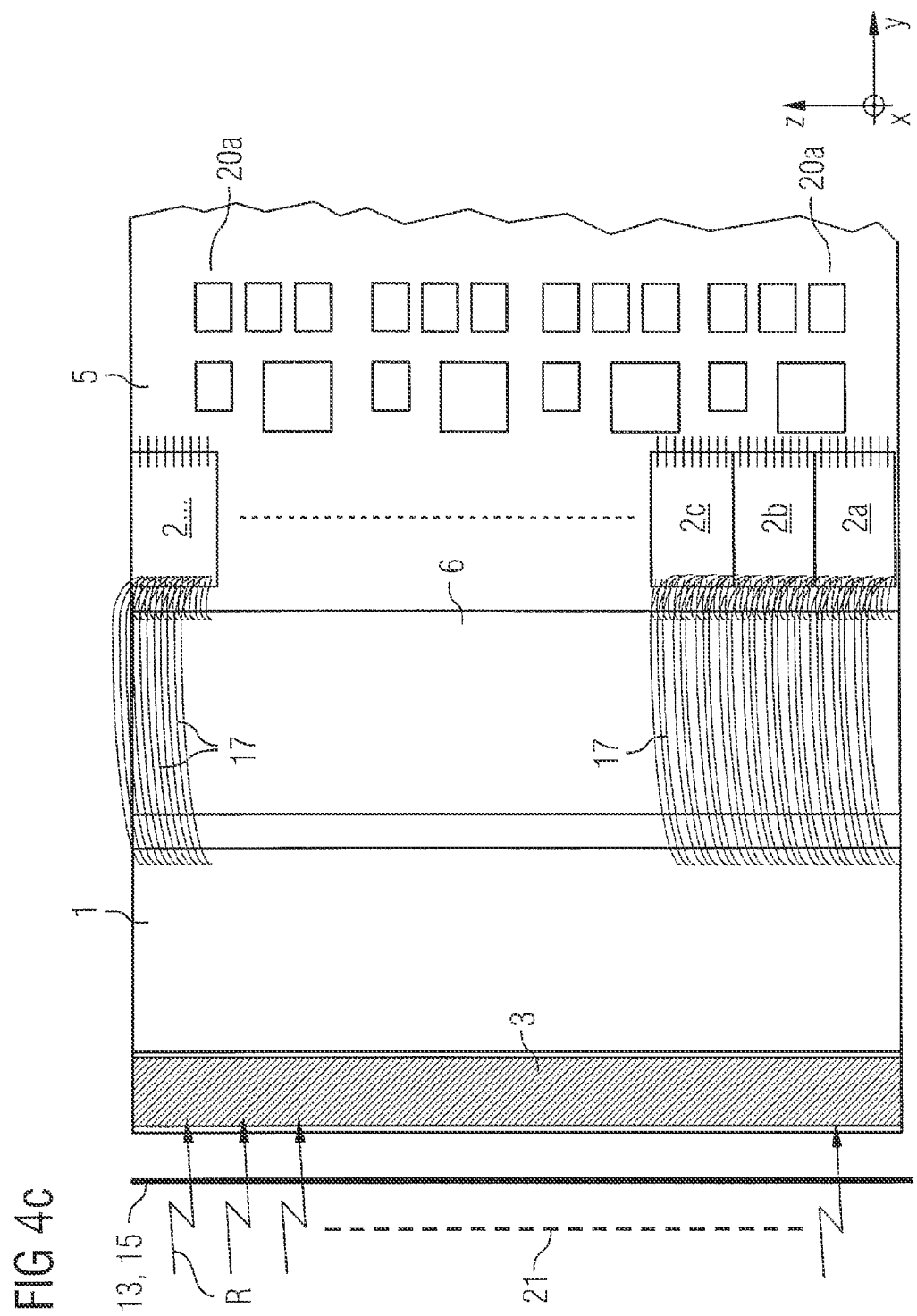

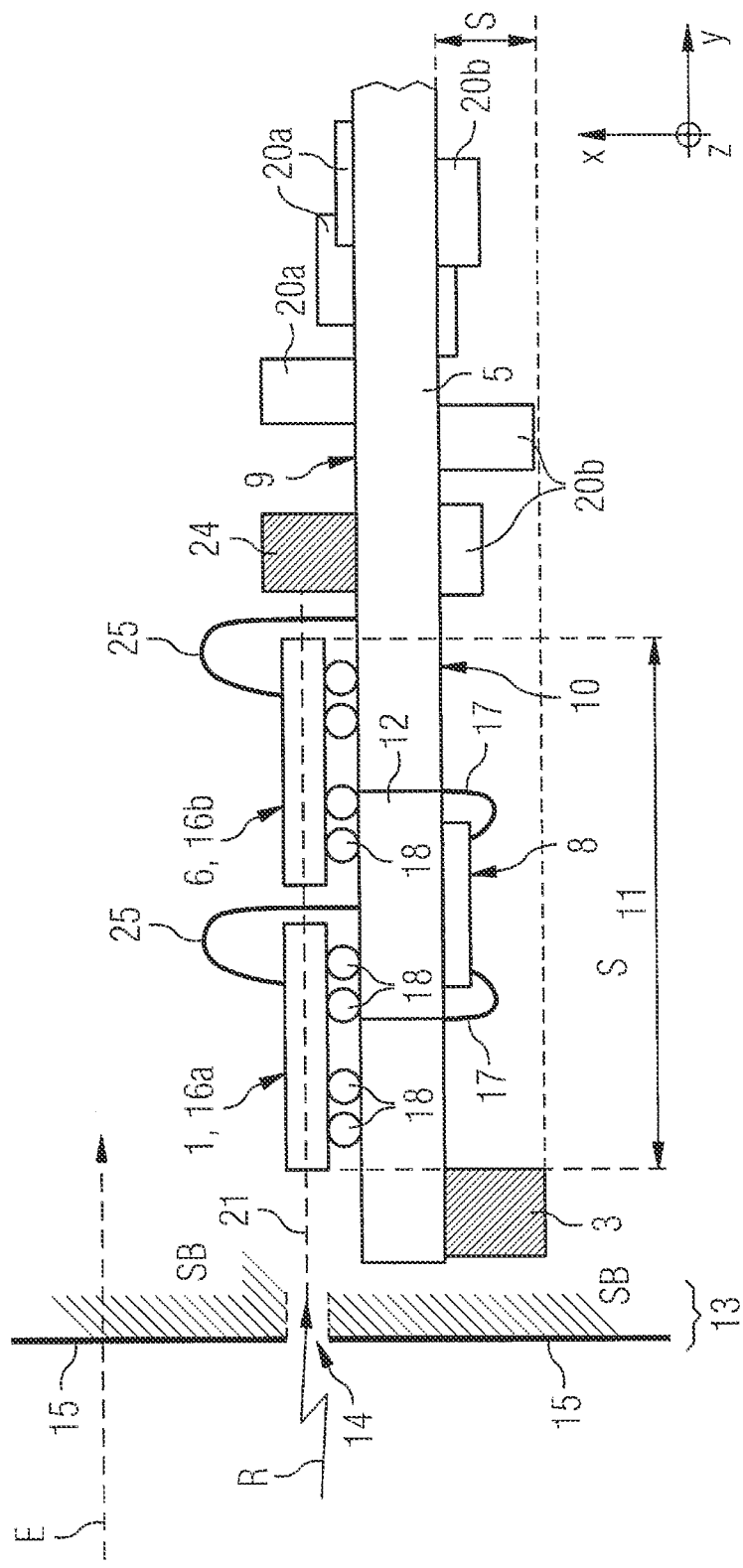

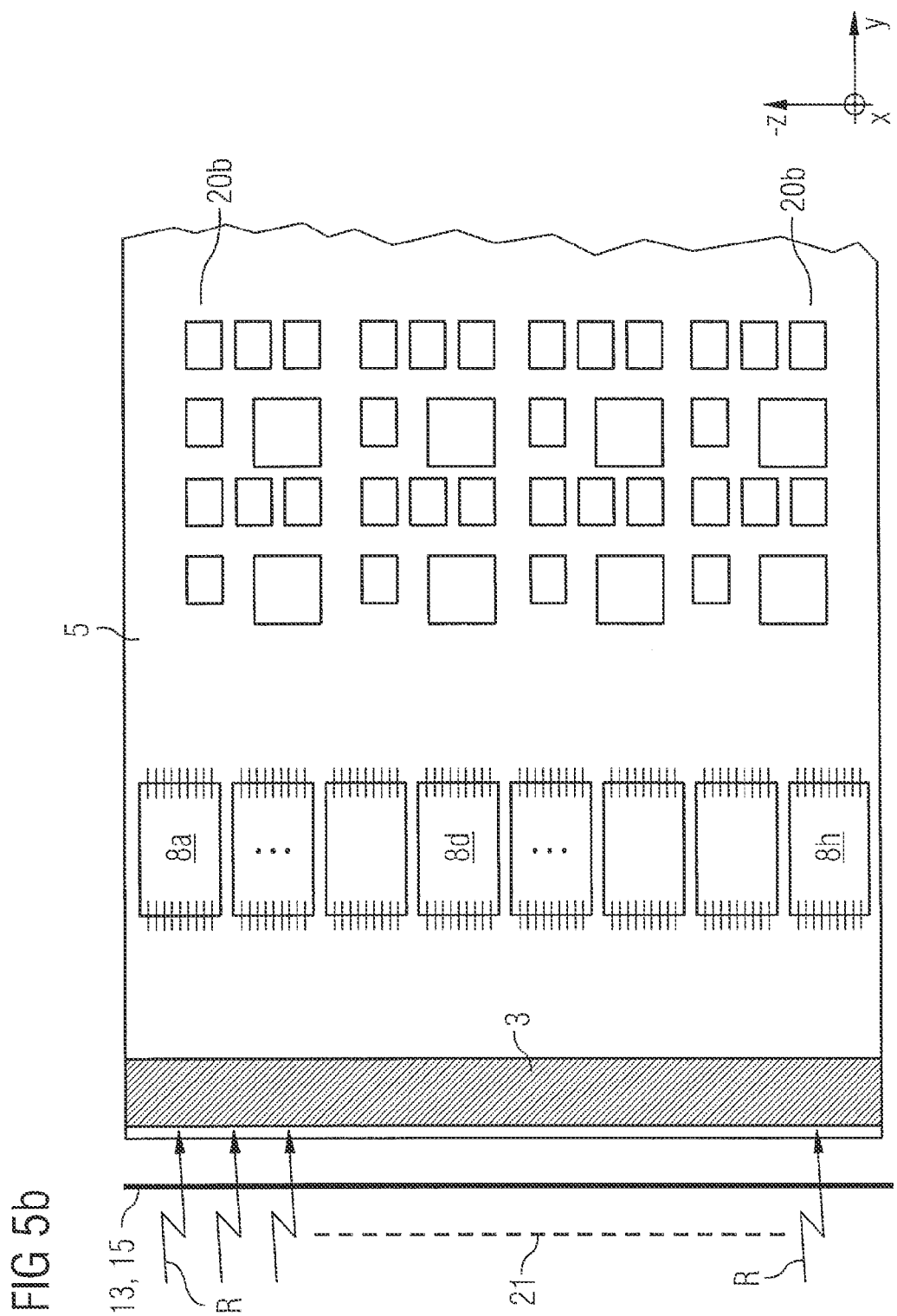

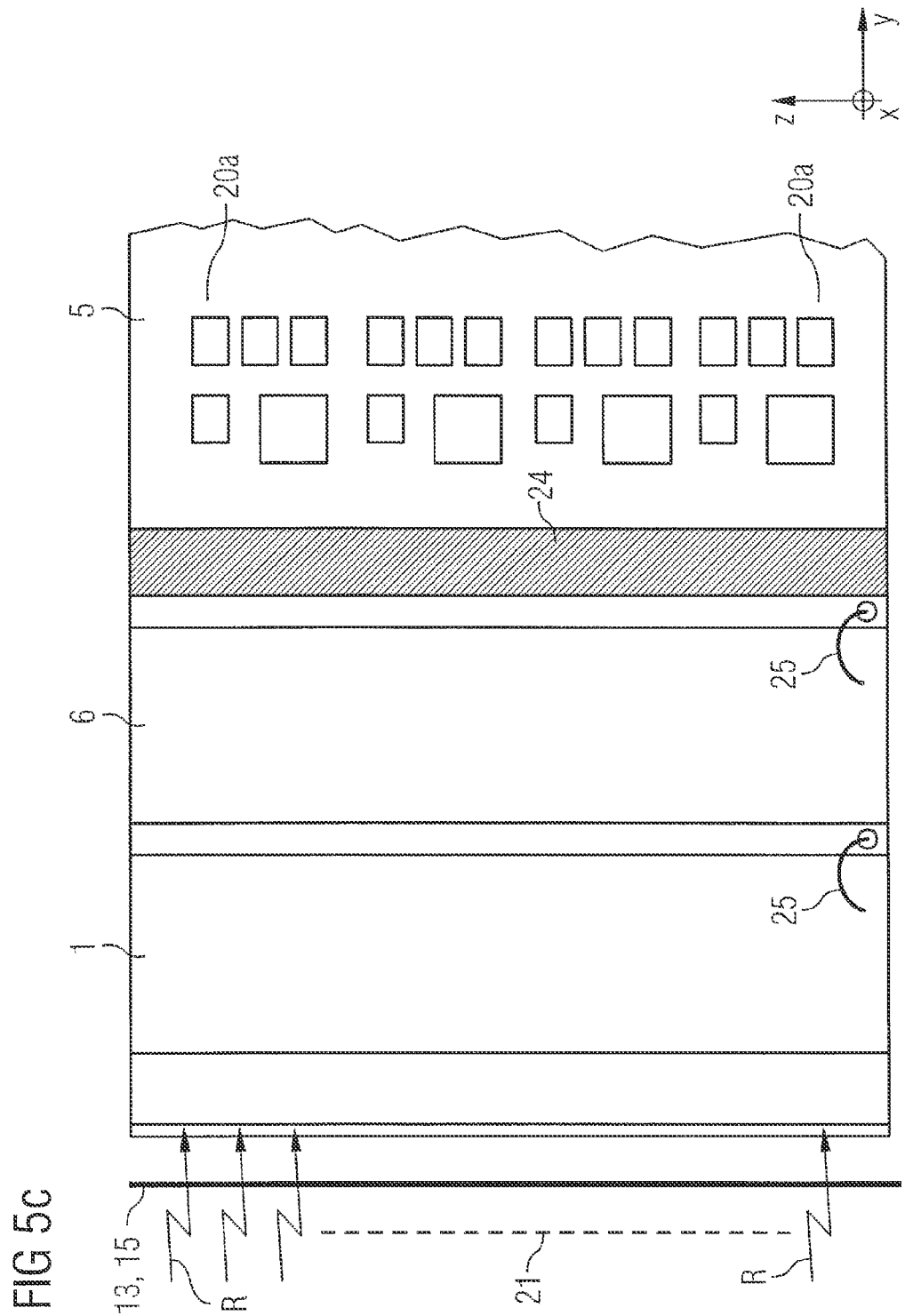

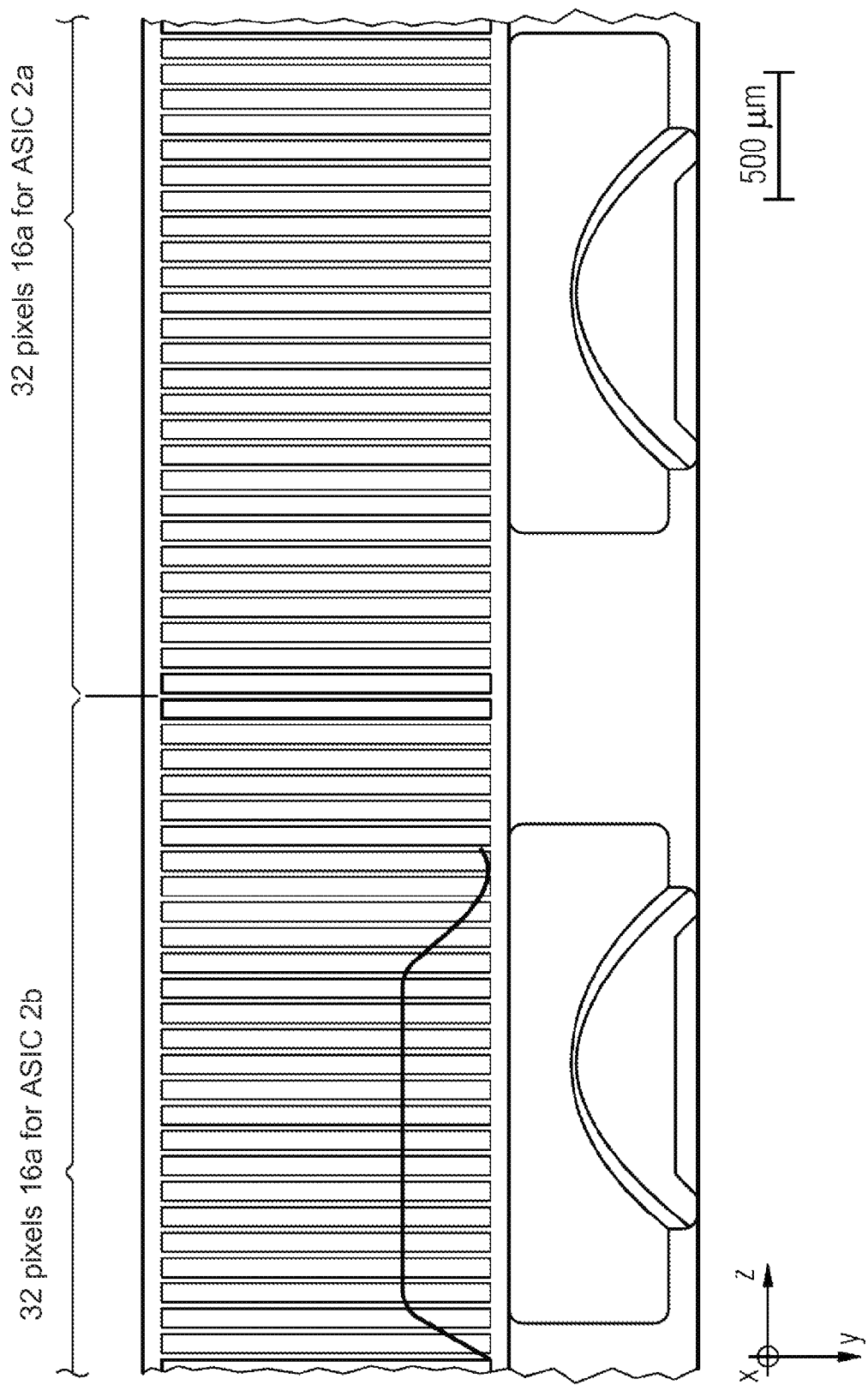

DIRECT CONVERSION X-RAY DETECTOR WITH RADIATION PROTECTION FOR ELECTRONICS

CLAIM OF PRIORITY

This application claims the benefit of priority, under 35 U.S.C. §119 (a)-(d), of German Patent Application Serial No. 10 2011 108 876.1, entitled "DIREKTWANDELNDER RÖNTGENDETEKTOR MIT STRAHLENSCHUTZ FÜR DIE ELEKTRONIK," filed on Jul. 28, 2011, benefit of priority of which is claimed hereby, and which is incorporated by reference herein in its entirety.

TECHNICAL FIELD

The present document relates to an X-ray detector having at least one X-ray sensor converting X-radiation directly into electrical charge carriers and to an arrangement of a plurality of such X-ray detectors.

BACKGROUND

Imaging detectors for X-radiation usually comprise a scintillator that converts the incident X-radiation into visible and/or ultraviolet light. This light is then captured by a photomultiplier tube (PMT) or a semiconductor detector (for example a charge-coupled device (CCD) photodetector) and is thus available for further processing, for example, in a connected computer system. See, e.g., DE 197 11 927 A1.

Disadvantages of the scintillator principle are, on the one hand, the limited spatial resolution since inorganic scintillators (e.g. on a zinc sulfide base or on a sodium iodide base) only emit visible light or UV light at so-called activator centers and this light is subsequently scattered in the scintillator, which has the consequence of a high crosstalk of, for example, one pixel of a CCD sensor with the pixels lying next to it. In addition, scintillators have the property of afterglow so that the dynamics and thus image sequence speed of such a sensor are negatively influenced. Further disadvantages result from the special features of the scintillators and/or their chemical composition: A complex manufacture as a monocrystal is thus required, for example, to ensure a sufficient light transmission: as a rule, there is a high sensitivity to environmental influences (such as moisture, for example), and the service life is limited. These special features are also reflected in a very high price of scintillator-based X-ray detectors.

Furthermore, an example of a direct conversion X-ray detector is described in DE 10 2009 008 702 A1. In these, electron-hole pairs are generated directly in the semiconductor material of the X-ray sensor of the X-ray detector by X-ray photons, said electron-hole pairs then being able to be separated and transported off by an applied electric field (corresponding e.g. to an applied voltage of e.g. 50 to 40 volts). A small electric current is thereby caused whose strength is proportional to the energy and to the intensity of the incident X-radiation.

SUMMARY

The present invention relates to direct conversion X-ray detectors. Since naturally only very small signal voltages or signal currents occur in such direct conversion X-ray detectors, the signal processing electronics (also called signal evaluation electronics in this document) connected downstream of the X-ray sensor (that is that component of the X-ray detector which includes the semiconductor material carrying out the direct conversion) can be arranged as close as possible to the X-ray sensor (or to the converting material) to minimize a coupling of interference and/or of noise voltages. Such electronics can be implemented as application specific integrated circuit(s) (also called ASICs) on a silicon base. Such electronics are, however, as a rule very radiation-sensitive to direct irradiation by high-energy radiation such as X-radiation or gamma radiation, which can result in irreversible parameter changes or even in the destruction of the active structures on the integrated circuit after a short irradiation time.

To avoid such problems up to and including destruction of the signal evaluation electronics, one approach (see, e.g., DE 10 2007 010 639 A1) can be to position the radiation-sensitive electronics outside the housing geometry of imaging components of X-ray detectors. This solution can, however, only be used with great difficulty or not at all in practice in direct conversion X-ray sensors since the electronics should be arranged close to the X-ray sensor in direct conversion detectors as described above.

An objective can be to provide an X-ray detector having at least one X-ray sensor converting X-radiation directly into electric charge carriers, wherein the signal evaluation electronics connected to the X-ray sensor(s) are arranged as close as possible to the X-ray sensor(s) and are nevertheless sufficiently, protected from the high-energy X-radiation. An objective can be to provide energy-selective direct conversion X-ray detectors. An objective can be to provide a direct conversion X-ray detector with which an improved thermal adaptation of the different materials used for the design of the detector is realized.

One or more of these objectives may be achieved by an X-ray detectors, such as described and claimed herein. Advantageous embodiments or arrangements of the X-ray detectors in accordance with one or more aspects of the present invention can result in this respect from the respective dependent claims.

The present subject matter will first be described generally in the following and then in detail with reference to individual embodiments. The individual features and/or individual assemblies shown in combination with one another in the individual embodiments in respect do not have to be realized in the configuration specifically show in the embodiments within the framework of the present invention, but can rather also be realized in other configurations. Individual ones of the components and/or features shown can in particular also be combined in a different manner with other components or features or can also be omitted. Each individual feature which is shown in an embodiment can in particular also be realized as a stand-alone feature, that is without the other individual features of the corresponding embodiment shown, and can already per se result in an advantage.

In this document, if it is stated within the present framework that a component (for example an X-ray sensor) is arranged on another component (for example on a sensor carrier) or between two other components (for example: a sensor carrier between an X-ray sensor and a substrate), this means that, if not otherwise stated, the plurality of components are fixedly connected to one another. This does not, however, preclude that this connection is not realized, e.g. by means of a thin, conductive adhesive layer, directly between two components so that e.g. two components arranged after one another do not have to be directly adjacent one another.

A (first) X-ray detector in accordance with an example of the present approach can include an X-ray sensor converting X-radiation directly into electric charge carriers (if a plurality of X-ray sensors are present, this X-ray sensor is also called a first X-ray sensor in the following). Signal evaluation electronics are electrically connected to the (first) X-ray sensor for deriving a signal from the X-ray sensor and for processing the derived signals. The signal evaluation electronics can in particular include one or more integrated circuit(s) (with the circuit(s) e.g. being able to be formed e.g. as ASIC(s)). An X-ray spectrum from a material which particularly easily absorbs X-ray photons of the X-ray spectrum used (maximum energy e.g. between 40 and 300 keV) is moreover provided for the protection of the signal evaluation electronics. This absorber can, for example, be formed from $ZrO_2$ ceramic material (e.g. also from lead). Finally, (at least) one sensor carrier is provided which is shaped and/or positioned such that the X-ray sensor can be positioned relative to the X-ray absorber by it.

In accordance with an example of the present approach, viewed in the direction of the incidence of the X-radiation, the signal evaluation electronics are on the one hand, arranged behind the X-ray absorber and in the X-radiation shadow of this X-ray absorber (the X-radiation shadow is in this respect that spatial region which arises in the direction of incidence of the X-radiation by parallel projection of the maximum cross-sectional area of the X-ray absorber in the plane perpendicular to the direction of incidence of the X-radiation). On the other hand, the X-ray sensor is positioned by means of the sensor carrier (e.g. by arrangement on the latter) such that the X-ray sensor is admittedly likewise disposed at least sectionally behind the X-ray absorber (viewed in the direction of incidence of the X-radiation). Unlike the signal evaluation electronics, the X-ray sensor is, however, positioned outside the X-radiation shadow of the X-ray absorber, by a suitable positioning with the aid of the sensor carrier.

In a first advantageous embodiment of this X-ray detector (this also applies to the variants of the X-ray detectors in accordance with the invention introduced in the following), the (first) sensor carrier can be arranged between the X-ray absorber and the signal evaluation electronics, viewed in the direction of incidence of the X-radiation. It is, however, in general equally conceivable first (viewed in this direction of incidence) to arrange the X-ray absorber, then the evaluation electronics and finally the sensor carrier (with the X-ray sensor supported by it) since this configuration, just like the one described above, also allows a positioning of the X-ray sensor very close to the signal evaluation electronics.

In a further advantageous embodiment variant, the (first) X-ray detector in accordance with the invention has a substrate which can in particular be formed as a circuit board. The X-ray absorber, the (at least one) sensor carrier and the signal evaluation electronics are then arranged together on this substrate. Viewed in the direction of incidence of the X-radiation, this preferably takes place in the order X-ray absorber, sensor carrier (one or more) and signal evaluation electronics. As described above, however, it is equally possible to have the signal evaluation electronics directly follow the X-ray absorber before then the at least one sensor carrier follows.

Furthermore, the material of the sensor carrier arranged between the substrate and the X-ray sensor viewed in the direction perpendicular to the direction of incidence of the X-radiation and perpendicular to the plane of the substrate has a thermal coefficient of expansion which lies between the thermal coefficient of expansion of the material of the substrate, on the one hand, and that of the material of the X-ray sensor, on the other hand (the thermal coefficient of expansion preferably lies exactly between that of the substrate and that of the X-ray sensor). The thermal expansion of the X-ray sensor can thus be adapted to that of the substrate, which is in particular of advantage with brittle materials such as GaAs as the X-ray sensor which are arranged on a ceramic carrier as a substrate (with both material then having different thermal coefficients of expansion) since GaAs is a brittle material in which stress cracks can occur in the described configuration without the above-described thermal adaptation via the temperature variations which occur in the operation of the X-ray detector.

The (first) sensor carrier advantageously has the same expansion viewed perpendicular to the direction of incidence of the X-radiation and perpendicular to the plane of the substrate as the X-ray absorber so that the sensor carrier fits exactly into the X-radiation shadow of the X-ray absorber, that is, is positioned just completely in this shadow.

In a further variant, the (first) X-ray detector in accordance with the invention is formed as an energy-selective direct conversion X-ray detector (alternatively also called an X-ray tandem sensor in the following). For this purpose, the detector includes a further, second X-ray sensor which converts the X-radiation directly into electric charge carriers and which is likewise electrically connected to the signal evaluation electronics for the signal derivation and signal evaluation. In addition, a further sensor carrier (second sensor carrier) is provided which is formed and arranged for positioning this second X-ray sensor relative to the above-described X-ray absorber. This second sensor carrier is, as described above for the first sensor carrier, preferably designed with respect to the thermal coefficient of expansion of its material so that the thermal expansion of the second X-ray sensor is adapted to that of the substrate.

The second X-ray sensor is arranged behind the first X-ray sensor viewed in the direction of incidence of the X-radiation and is positioned by means of the second sensor carrier (e.g. in that the latter is positioned beneath the second X-ray sensor) behind the X-ray absorber, but outside the X-radiation shadow thereof. In a fully analog manner to the first X-ray sensor and to its first sensor carrier, the second sensor carrier can have the same expansion, viewed perpendicular to the direction of incidence of the X-radiation and perpendicular to the plane of the substrate, as the X-ray absorber (and optionally also the first sensor carrier) so that the second sensor carrier is positioned completely in the X-radiation shadow of the X-ray absorber and raises the second X-ray sensor assisted by it just completely out of the X-radiation shadow of the X-ray absorber.

In a further variant, the first and/or second sensor carrier (preferably: both sensor carriers) are designed as electrically conductive and for the selective voltage supply of the first and/or second X-ray sensor. For example, such a sensor carrier arranged between a ceramic substrate and a GaAs X-ray sensor can comprise $Al_2O_3$ containing a conductive component. (The voltage supply can, however, alternatively to this or in combination therewith also be realized with the aid of a thin conductive adhesive layer introduced between the sensor carrier and the X-ray sensor.)

A (second) X-ray detector in accordance with an example of the present approach has the following structure: The X-ray detector includes a substrate, in particular a circuit board, a first and a second X-ray sensor (which both respectively convert X-radiation directly into electric charge carriers) which are both arranged on a first side of the substrate, signal evaluation electronics (which are arranged on the second side of the substrate disposed opposite the first side and there preferably in the section disposed opposite the two X-ray sensors) electrically connected (for the signal derivation and signal evaluation) to the two X-ray sensors and preferably designed as integrated circuit(s) and includes an X-ray absorber formed for protecting the signal evaluation electronics and positioned on the second side of the substrate in front of the signal evaluation electronics viewed in the direction of incidence of the X-radiation. The X-ray absorber is positioned so that the signal evaluation electronics are arranged in the X-radiation shadow of the X-ray absorber.

A variant of this (second) X-ray detector has an electric connection (for transmitting the sensor signals to the signal evaluation electronics) between at least one of the X-ray sensors and the signal evaluation electronics which is based on electrically conductive vias leading through the substrate.

Further advantageous embodiment variants of the first or second X-ray detector in accordance with an example of this approach can be realized as follows:

The two X-ray sensors of the detector can be designed for absorbing different spectral portions of the incident X-radiation. In this respect, the first X-ray sensor (facing the incident radiation) is preferably designed for absorbing a low-energy radiation portion. This X-ray sensor can be formed from silicon or can contain silicon for this purpose. The second X-ray sensor (that is the X-ray sensor remote from the incident X-radiation, that is optionally disposed in the X-radiation shadow) is then preferably designed for absorbing a portion of the incident X-radiation which is of higher energy in comparison with the first X-ray sensor. The second X-ray sensor can comprise or consist of GaAs for this purpose. The atomic numbers or the mean atomic numbers of the two semiconductor materials of the two X-ray sensors are thus advantageously different.

In a further variant of the first or of the second X-ray detector in accordance with the invention, an additional beam stop is provided which is preferably equipped with a slit-shaped aperture. This beam stop can be a housing section of a housing which is designed for receiving the components of the X-ray detector in accordance with the invention. The beam stop (or the corresponding housing section) is in this respect arranged and oriented before the first (or before the two) X-ray sensor(s) and preferably also before the X-ray absorber in the direction of incidence of the X-radiation such that the X-ray sensor's is/arc just not arranged in the X-radiation shadow of the (beam absorbing) wall of the beam stop or of the housing, but rather just behind the aperture.

In a further variant, the above-described X-ray detectors in accordance with the invention are formed as one-dimensional line detectors. For this purpose, the X-ray sensor(s) viewed perpendicular to the direction of incidence of the X-radiation and in the substrate plane have a plurality of individual pixels which are designed for the spatially resolved detection of the X-radiation. The individual pixels are then each connected to the signal evaluation electronics, for example via bond wires and/or flip-chip contacts, for transmitting and evaluating the sensor signals generated by them.

In the (energy-selective) case of the provision of two X-ray sensors in such a line sensor structure, viewed in the direction of incidence of the X-radiation, the pixels of the first X-ray sensor, on the one hand, and of the second X-ray sensor, on the other hand, are advantageously positioned as follows: The pixel cross-sectional surfaces of the first X-ray sensor projected in parallel in this direction of incidence are incident exactly onto the cross-sectional surfaces of the pixels of the second X-ray sensor. In this case, identical spatial information can be gained with the two line sensors.

These above-described line sensor structures can then be used for forming an arrangement of X-ray detectors spatially resolving in two dimensions: The individual line sensors can be stacked with their substrate planes in parallel lying above one another so that the individual line sensor structures of the first or of the first and second X-ray sensors form one or two two-dimensional area sensor structure(s) in the plane viewed perpendicular to the direction of incidence of the X-radiation.

In a further variant in which (energy-selectively) two different X-ray sensors are realized, the two X-ray sensors can be supplied completely independently of one another with the respective required electric voltage. It is in particular advantageous to design the high-voltage supply for the charge separation separately for each X-ray sensor when different high voltages are required for both sensors. Furthermore, the one high-voltage supply or the two high-voltage supplies can be equipped with a sensitive current monitoring in order to recognize possible high-voltage avalanche breakdowns of the semiconductors fast and to switch off the high voltage fast in this case.

In an example, the radiation protection for electronics disposed downstream of the X-ray sensor(s) and sensitive to the X-rays can thus in particular be ensured with linear X-ray detectors. This in particular relates to the signal evaluation electronics, but can also relate to a number of other, passive (more radiation sensitive) components in that they are also arranged in the radiation shadow of the X-ray absorber. (The above-described aperture diaphragm with a slit-shaped aperture which as a rule forms part of the housing is not sufficient for this purpose: Due to design constraints such as a maximum housing weight, the aperture diaphragm cannot be designed so thick that it can alone ensure the radiation protection of the sensitive electronics.)

Not only the X-radiation behind the X-ray sensor(s) can particular be reduced to a minimum (and thus a sufficient protection of the sensitive components from X-radiation be ensured) by the advantageous realization of the additional X-ray absorber in conjunction with the sensor carrier(s) in a shape adapted with respect to the thermal coefficient of expansion, but an optimum thermal adaptation of the individual components of the X-ray detector, in particular of the X-ray sensor(s) to the carrying substrate can rather also be realized.

In an example, a low-absorbing semiconductor X-ray sensor (e.g. made from Si) and a high-absorbing semiconductor X-ray sensor (e.g. made from GaAs) of the same thickness are mutually aligned on as substrate or interconnect device such that X-ray photons first pass through the low-absorbing semiconductor and then the high-absorbing semiconductor.

In this respect, the two X-ray sensors can be provided with geometrically the same electrode structures which serve as pixel electrodes so that either line detectors or surface detectors can be manufactured. The pixel structures of the two energy-selective X-ray sensors arranged after one another can in this respect be arranged in parallel with one another to deliver the same spatial information (e.g. for image processing in a computer system connected downstream of the signal evaluation electronics).

The two energy-selective X-ray sensors can be realized as separate components or can also be integrated in one and the same component (for example also by pouring into a corresponding molding compound). They can respectively be provided with their own high-voltage supply to achieve a charge separation ideal for the respective semiconductor type. Both X-ray sensors can be built (as separate components or also integrated in one component) with customary processes of architectural and connection technology of electronics such as wire bonding or flip-chip bonding, for example mounted on the interconnect device.

If the X-ray sensor (or the two energy-selective X-ray sensors respectively) are designed as a line sensor or also an area sensor, the geometrical arrangement can take place such that a plurality of individual pixels are arranged next to one another with minimal positional errors. Line sensors or area sensors with a high pixel number, e.g. with 1024 pixels per line or with 1024×1024 pixels in the area are thus possible.

BRIEF DESCRIPTION OF THE DRAWINGS

The present subject matter will be described in the following with reference to a plurality of embodiments.

There are shown:

FIG. 1: the basic principle of direct conversion, such as is used in an example of the present subject matter;

FIG. 2: the basic principle of an energy-selective X-ray detector with two different X-ray sensors in accordance with the present subject matter;

FIG. 3: a first X-ray detector in accordance with the present subject matter with an X-ray sensor;

FIGS. 4a to 4c: a second X-ray detector in accordance with the present subject matter with two different X-ray sensors;

FIGS. 5a to 5c: a further X-ray detector in accordance with the present subject matter with two different X-ray sensors;

FIG. 6: a drawing of the line structure of an X-ray detector in accordance with the present subject matter.

DETAILED DESCRIPTION

Figure 4A:
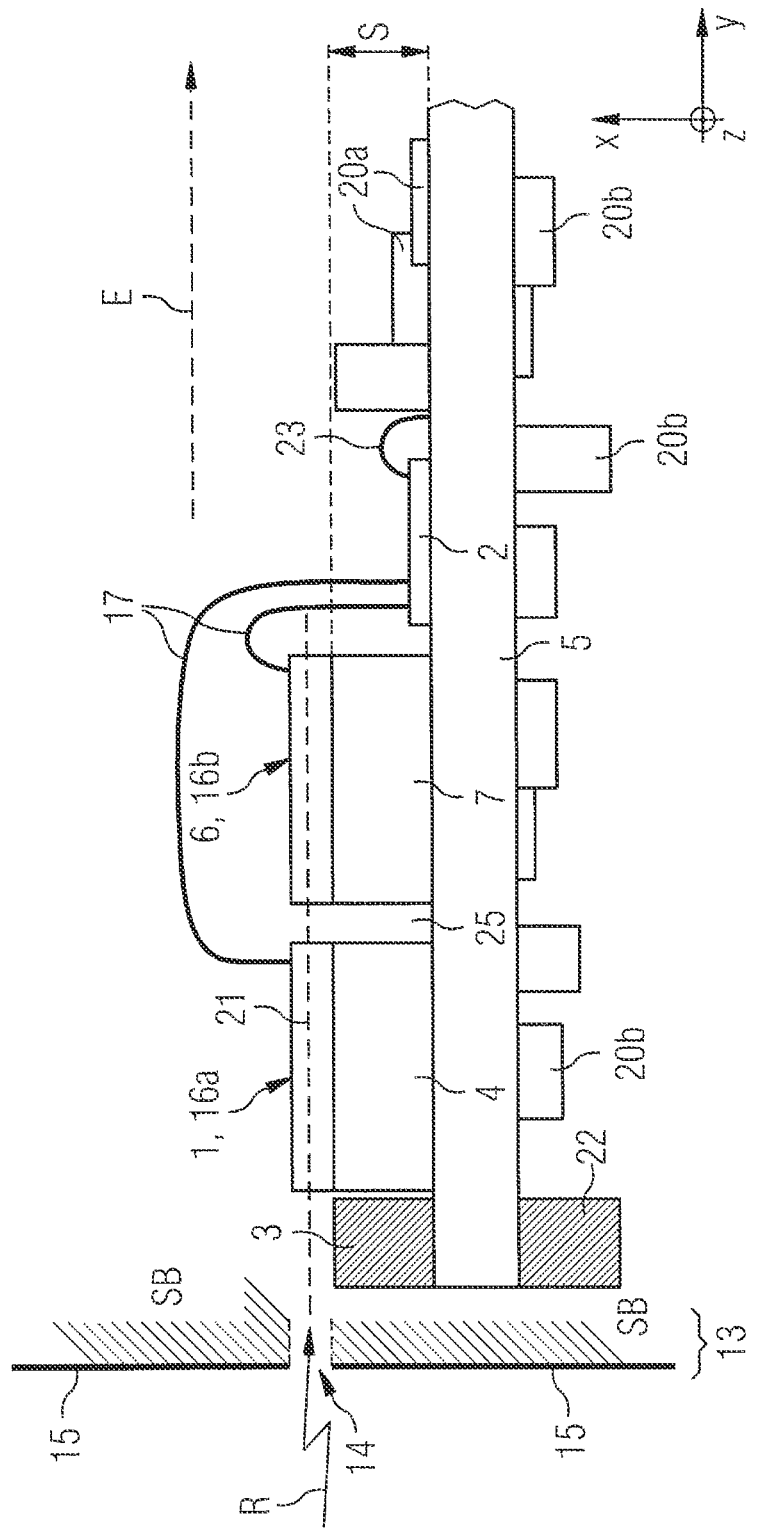

FIG. 1 shows the basic principle of direct conversion such as is used in X-ray detectors in accordance with the invention or in their X-ray sensors. The X-ray photons generate electron-hole pairs in the X-ray sensor material which can be separated by the applied electric field of the DC voltage $V_{bias}$ and can be transported off to the electrodes. In this respect, the structure of the one electrode can be seen at the right in the Figure in the form of a plurality of individual pixel electrodes, which allows a spatially resolving detection of the X-ray photons. A (small) electric current (an X-ray photon of 60 keV thus e.g. generates on average approx. $10^5$ electron-hole pairs in GaAs) is caused by the transporting away of the charge and its strength is proportional to the energy and to the intensity of the incident X-radiation. To avoid interfering electric effects (such as a capacitive coupling between individual bond wires of individual pixels), it is necessary as described above that line paths are present which are as short as possible between the X-ray sensor and the downstream, amplifying and evaluating signal evaluation electronics.

On the absorption of the X-ray photons, different effects occur as main effects in dependence on the atomic number of the semiconductors of the X-ray sensor. The Compton effect, in which some of the X-ray photon energy is output to a shell electron of the semiconductor with the consequence of the scattering of the X-ray photon and of the generation of a Compton electron, is thus predominant in semiconductors with a low atomic number (for example silicon). In semiconductors with a higher atomic number (e.g. GaAs), in contrast, the photo effect dominates; the result is an emission of an electron from a shell of the electron shell of the semiconductor as a consequence of the absorption of the X-ray photon.

FIG. 2 shows the basic principle of the X-ray detectors in accordance with the invention with two different (energy-selective) X-ray sensors: If a low-absorbing semiconductor detector (e.g. silicon) is combined with a high-absorbing semiconductor detector (e.g. gallium arsenide), this tandem detector or tandem sensor utilizes both the Compton effect and the photo effect for the detection of the X-radiation and thus achieves a substantially higher total intensity.

If the two parts of the X-ray detector (that is the two X-ray sensors) are designed so that a high-voltage source of their own can respectively be associated with them for evacuation of the charge carriers, an ideal working point can be set for each of the two X-ray sensors.

(See the following embodiments for the meaning of the reference numerals in FIG. 2.)

FIG. 3 shows a first X-ray detector in accordance with the present subject matter with only one X-ray sensor in cross-section in a plane in the direction of incidence E of the X-radiation R and perpendicular to the substrate plane. Here (and also in the following Figures or embodiments) the y direction defines the direction of incidence E of the X-radiation R in a Cartesian coordinate system x, y, z. The substrate plane corresponds to the y-z plane. The individual pixels of the X-ray sensors 1, 6 (see below), which are not shown here (either in FIGS. 4a to 4c or 5a to 5c), but cf. FIG. 6, extend in the z direction. FIG. 3 (as also the embodiments of FIGS. 4 and 5 and the prototype of FIGS. 6 and 7) thus shows an embodiment of the X-ray detector in accordance with the invention or its X-ray sensors as a one-dimensionally spatially resolving line structure. By stacking a plurality of such line structures shown in FIG. 3 (or also in the further Figures) in the direction perpendicular to the substrate plane α-direction) so that the individual substrate planes lie parallel to one another, corresponding two-dimensionally spatially resolving area sensors can then be manufactured.

In the embodiment shown in FIG. 3 and in the further embodiments shown in FIGS. 4 and 5, if not otherwise stated, identical reference numerals designate identical components or features of the present subject matter.

The one-dimensional line detector shown in FIG. 3 has a ceramic carrier 5 as a circuit board substrate. A plurality of individual ASICs, which here form the signal evaluation electronics 2 are bonded to the substrate surface disposed at the top here. A parallelepiped-shaped X-ray absorber 3 made from non-conductive $ZrO_2$ ceramics and oriented with its longitudinal axis in the z direction is likewise bonded onto the upper side of the substrate 5. Finally, a likewise parallelepiped-shaped sensor carrier 4 made from $Al_2O_3$ and likewise oriented with its longitudinal axis in the z direction is bonded onto the upper side of the substrate 5.

The X-ray absorber 3, the sensor carrier 4 and the signal evaluation electronics 2 are arranged after one another in the direction of incidence E of the rays of the X-radiation R, that is in the y direction. The extents or heights of the X-ray absorber 3, on the one hand, and of the sensor carrier 4, on the other hand, are identical viewed in the direction perpendicular to the substrate plane (that is in the x direction) and are here, for example, twice as big as the corresponding extent or height of the signal evaluation electronics 2. The signal evaluation electronics 2 is thus arranged completely or over its total length in the z direction behind the X-ray absorber 3 (and also behind the sensor carrier 4) in the X-radiation shadow S of the X-ray absorber 3 and is thus completely protected from the X-radiation. The X-ray absorber 3 here has an extent in the y direction which absorbs at least 70% of the X-radiation energy still incident on the X-ray absorber (behind the beam stop 13, see below) to protect the evaluation electronics 2 from the high-energy X-radiation R. Viewed in the direction of irradiation E, further electronic components 20 are arranged behind the evaluation electronics 2 and are likewise disposed in the radiation shadow S of the absorber 3 (and are thus likewise protected from the X-radiation R). The dimensions of the $ZrO_2$ absorber strip 3 here amount, for example (in the y, y and z direction), to 1.4 mm×2.0 mm×102.8 mm.

The sensor carrier 4, which is here formed directly behind the absorber 3, that is without any intermediate space, in the irradiation direction E, is provided with a bonded X-ray sensor 1 made from GaAs on its upper side. The extent of the X-ray sensor 1 in the y direction and in the z direction here corresponds in each case to the corresponding extent of the sensor carrier 4. Since the x extent of the elements 3 and 4 is the same, the X-ray sensor 1 is thus disposed directly above the radiation shadow S of the X-ray absorber 3, that is it is just not shaded by the latter viewed with respect to the incident X-radiation R.

A housing section 13 of a housing (not shown completely here) surrounding the components of the X-ray detector and disposed perpendicular to the substrate plane and to the direction of incidence E is provided in front of the X-ray absorber 3 (and thus also in front of the further elements 1, 4, 2, 5 and 20) in the direction of irradiation E. The housing section 13 is here formed from thin walls 15 of a likewise radiation-absorbing material (e.g. stainless steel with a thin lead coating). At the level of the X-ray sensor 1 (and with an identical extent or slit width as the latter in this direction) viewed in the x direction, the housing section 13 has a slit-shaped interruption (opening 14) of its wall 15 extending along the z direction. The X-radiation R can thus be incident onto the X-ray sensor without impediment in the y direction over the total cross-sectional surface of the X-ray sensor in the x-z plane. All the components of the X-ray detector shown which are disposed on an x level outside the X-ray sensor 1 are in contrast disposed in the X-radiation shadow SIB of the wall 15 of the beam stop 13 so that e.g. the elements 2 and 20 also already experience a certain (albeit not sufficient) radiation protection by this wall 15.

As indicated in FIG. 3, there is an electric connection formed by bond wires 17 for signal derivation between the X-ray sensor 1 and its signal evaluation electronics 2. Since, viewed in the direction of incidence E, the signal evaluation electronics 2 can be arranged directly behind the X-ray sensor 1 or the sensor carrier 4, practically abutting the latter (not shown here) due to the above-described manner of construction, an advantageous, very short line path for the electric connection 17 results in accordance with the invention. The incident X-radiation R is spatially restricted by means of the aperture diaphragm 13. To protect the evaluation circuit 2 and the downstream electronic components 20 from the incidence of X-ray photons, the X-ray sensor 1, which is connected to the evaluation circuit 2 by means of bond wires 17, is placed onto the sensor carrier 4.

The material (here $Al_2O_3$) of the sensor carrier 4 in this respect has a thermal coefficient of expansion which lies between the thermal coefficient of expansion of the material of the X-ray sensor 1 (here GaAs) and the material of the circuit board 5 (here circuit board ceramic material). Strains and deformations by varying temperatures (between the elements 1 and 5) are hereby minimized. Since the ceramic carrier 4 has an identical height in comparison with the X-ray absorber 3, it can be achieved that, on the one hand, X-ray photons reach the sensor 1 without restriction and that, on the other hand, the number of X-ray photons which arrive behind the sensor are reduced to a minimum.

FIG. 4 shows a further embodiment in accordance with the present subject matter of an X-ray detector in accordance with the invention having two different X-ray sensors 1, 6 (that is of a tandem line sensor) in a cross-section (FIG. 4a) corresponding to FIG. 3, in a view of the substrate 5 from below (FIG. 4b) and in a plan view of the substrate from above, that is of the X-ray sensors 1, 6 and of the signal evaluation electronics 2 (FIG. 4c). The architecture in this respect generally follows the X-ray detector in accordance with the invention shown in FIG. 3 so that in the following only the differences will be described (identical reference numerals in FIG. 4a and in FIG. 3 therefore designate identical components).

The X-ray detector of FIG. 4 has a further second sensor carrier 7 on the upper substrate side between the above-described (first) sensor carrier 4 and the signal evaluation electronics 2. Said second sensor carrier is aligned parallel to the elements 3, 4 and is formed identical to the first sensor carrier 4 in its size. The elements 3, 4 and 7 thus have the same height in the x direction, with the first and the second sensor carrier 4, 7 and the signal evaluation electronics 2 each being arranged, viewed in the direction of irradiation E, directly after one another and each being arranged in the X-radiation shadow S of the X-ray absorber only separated by narrow air gaps. (The further electronic components behind the evaluation electronics 2, viewed in the direction of irradiation E, which here have the reference numeral 20a, are arranged in the radiation shadow S.)

An air gap 25 having an extent of at least 1 mm is provided between the elements 1 and 6, on the one hand, and the elements 4 and 7, on the other hand, for the high-voltage separation (so that the two sensors 1 and 6 can be operated with different high voltages for reaching a charge separation ideal for the respective semiconductor type Si or GaAs, see below).

The second X-ray sensor 6 is formed on the upper side of the second sensor carrier 7 (at the same level seen in the x direction and in an identical geometrical configuration and orientation as the first X-ray sensor 1). The X-ray photons not absorbed in the first X-ray sensor 1 and incident through the slit 14 can thus be absorbed in the second X-ray sensor 6. In the present case, the first X-ray sensor 1 is now made from silicon and the second X-ray sensor 6 from GaAs.

The first sensor carrier 4 is here made e.g. from conductively structured glass; the second sensor carrier 7 arranged between this first sensor carrier 4 and the signal evaluation electronics 2 from conductively structured $Al_2O_3$.

Both sensor carriers 4, 7 thus adapt the thermal coefficients of expansion of their respective sensor 1, 6 ideally to those of the substrate 5.

The two X-ray sensors 1 and 6 are each fastened to the upper side of their respective sensor carrier 4, 7 by conductive adhesive. The high-voltage supply to the two X-ray sensors 1, 6 thus takes place here (as also in FIG. 3) with the assistance of a high-voltage electrode (not shown) which is led over the upper side of the substrate 5 and which is connected to the sensors 1, 6 via the two sensor carriers 4, 7 and the corresponding adhesive layers.

As FIGS. 4a and 4c show, the individual pixels (cf. FIGS. 1, 2 and 6) 16a and 16b of the sensors 1 and 6 are conductively connected to the signal evaluation electronics 2 (or to their individual ASICs 2a, 2b, . . . ) by means of bond wires 17. The bond wires 23 connect the ASICs 2a, 2b, to further electronic modules of the detector. Further electronic components 20b are arranged on the lower side of the substrate 5, here behind a further X-ray absorber 22 likewise arranged on this lower side and viewed in the direction of incidence E at the level of the absorber 3, in the X-radiation shadow of the further X-ray absorber 22 (likewise formed from $ZrO_2$ like the absorber 3). The further components 20b, the components 20a and the evaluation electronics 2 are connected to one another via conductive vias (not shown here) which lead from the upper side through the substrate 5 onto its lower side.

The reference numeral 21 here designates the plane of incidence of the X-radiation R through the slit 14 (which is thus disposed parallel to the substrate plane). The X-ray sensors 1, 6 shown in FIG. 4 are thus designed solely with bond wires 17 with respect to the electric connection technology.

The X-ray detector shown in FIG. 4 has the advantage, in particular due to the small spacing between the two X-ray sensors 1 and 6 (or their individual pixels 16a and 16b) that the two X-ray sensors 1 and 6 detect practically the same spatial information.

The passivation layers (e.g. made from SiN) required for the passivation of the semiconductors Si or GaAs are now shown in FIGS. 3 and 4 (nor in the following in FIG. 5).

FIG. 4 thus shows a first realization variant of a tandem line sensor in accordance with the invention. The X-radiation R passes through a slit aperture 14 in the sensor head housing (wall 15) which thus defines the radiation plane 21. The sensor head housing already provides the enclosed electronics 2, 20a and 20b with a certain radiation protection which is, however, not sufficient for design reasons (size, thickness and weight of the housing) to ensure a longer service life, in particular of the signal evaluation electronics 2. Two absorbers 3, 22 of highly absorbing material (here zirconium oxide as a non-conductor if the design permits conductive material, tungsten or lead can also be used) are therefore positioned on the interconnect device 5 for the protection of the electronic elements 2, 20a, 20b so that they lie between the X-ray source and the electronics in the beam path.

In order, however, to enable the access of the X-radiation to the actual sensor elements 1 and 6, these elements 1, 6 are mounted on the specific sensor carriers 4, 7 which ensure that the sensors 1 and 6 do not lie in the radiation shadow S of the absorber 3. The sensor carriers 4 and 7 thus have a triple function in the presented detector: They serve, on the one hand, the adaptation of the thermal coefficient of expansion of the sensor material to the thermal coefficient of expansion of the substrate (e.g. organic circuit board material or also inorganic aluminum oxide). On the other hand, they serve the conductive contacting between the substrate and the sensor for the high-voltage supply. Finally, the serve the exact positioning of the sensors 1, 6 relative to the absorber 3 and to the slit 14.

The contacting of the individual pixel electrodes 16a, 16b of the X-ray sensors 1, 6 to the amplifier electronics 2 takes place through wire bonding 17.

FIGS. 5a to 5c finally show a further tandem X-ray detector in accordance with the invention having two differently energy-selective X-ray sensors 1 and 6. Identical reference numerals (compared with FIGS. 3 and 4) again designate identical components, even if they may be positioned differently.

The two X-ray sensors 1 and 6 are also arranged in the X-radiation plane 21 at the level of the gap 14 in the housing wall 15 (viewed in the x direction) in the X-ray detector shown in FIG. 5 (and are formed and arranged in identical manner to the case shown in FIG. 4 except for the differences shown below). All other components of the X-ray detector are disposed at least sectionally in the X-radiation shadow SB of the wall 15, the electronic components 8, 20b even in the X-radiation shadow S of the X-ray absorber 3 arranged on the lower side 10 of the substrate 5 or the electronic components 20a lie in the radiation shadow of the further X-ray absorber 24 arranged on the upper side 9 of the substrate 5 behind the two X-ray sensors 1 and 6 viewed in the direction of irradiation E, and otherwise formed exactly like the X-ray absorber 3.

Viewed in the direction of irradiation E, the first X-ray sensor 1, the second X-ray sensor 6, the X-ray absorber 24 protecting the electronic components 20a and these components 20a are thus fixed behind one another on the upper side 9 of the substrate 5. Viewed in the direction of irradiation E, the X-ray absorber 3 is first arranged on the lower side 10 of the substrate 5 viewed in the direction of irradiation E on the side facing the housing aperture 13 and behind it viewed in its X-radiation shadow S and in this order the signal evaluation electronics 8 and the further electronic components 20b are arranged. The signal evaluation electronics 8 are in this respect arranged on the lower side 10 at the height of the two X-ray sensors 1 and 6 viewed in the y or E directions, that is in a region 11 of the lower side 10 opposite these two sensors.

In contrast to the embodiments shown in FIGS. 3 and 4, the electric contacting is designed as follows in the present case: The two sensors 1 and 6 are directly provided with corresponding conductor tracks (the latter not shown) formed on the upper side 9 of the substrate 5 by means of flip-chip contacts 18. These conductor tracks are connected to the lower side 10 of the substrate 5 via electrically conductively molded vias 12 suitably penetrating the substrate 5, that is formed between the upper side 9 and the lower side 10 of the substrate 5. The vias 12 exiting the lower side 10 then lead via bond wires 17 to the signal evaluation electronics 8 in the X-radiation shadow S.

As FIG. 5b shows, the evaluation electronics 8 here comprise a plurality of individual ASICs 8a to 8h, with a respective ASIC being connected to 32 pixels 16a, 16b of the corresponding sensor 1, 6 (FIG. 5a).

The variant shown in FIG. 5 for realizing a tandem X-ray detector in accordance with the invention with energy selectivity and integrated radiation protection thus shows two sensors 1 and 6 which are mounted on the substrate side opposite the ASICs 8a, 8b, . . . . These integrated circuits 8a, . . . are thus already removed from the direct beam path through the slit 14. In addition, the radiation absorber 3 is arranged in front of the amplifier electronics 8. On the upper side, the X-ray absorber 24 arranged between the rear sensor 6 and the further components 20a viewed in the direction of irradiation E protects said further components.

The connection of the pixel electrodes 16a, 16b of the sensors 1, 6 to the corresponding inputs of the circuits 8a, 8b, . . . takes place by a flip-chip contacting 18 on the sensor side and (by means of a connection via the vias 12) by corresponding wire bond contacts 17 on the lower side or on the circuit side. The conducting of the sensor signals through the substrate 5 to the amplifier circuits 8 thus takes place by conductive vias 12 by means of corresponding bores through the substrate. The feed of the high voltage in this case takes place by wire bond connections 25 between the sensors 1, 6 and corresponding feed au lines (not shown) printed on the upper side 9 of the substrate 5.

FIG. 6 finally shows a photograph (detail) of the pixel structures 16a of a first X-ray sensor 1 of an X-ray detector in accordance with the invention. 32 respective pixels 16a are associated with an ASIC of signal evaluation electronics 2 (or also 8).

Figure 7:
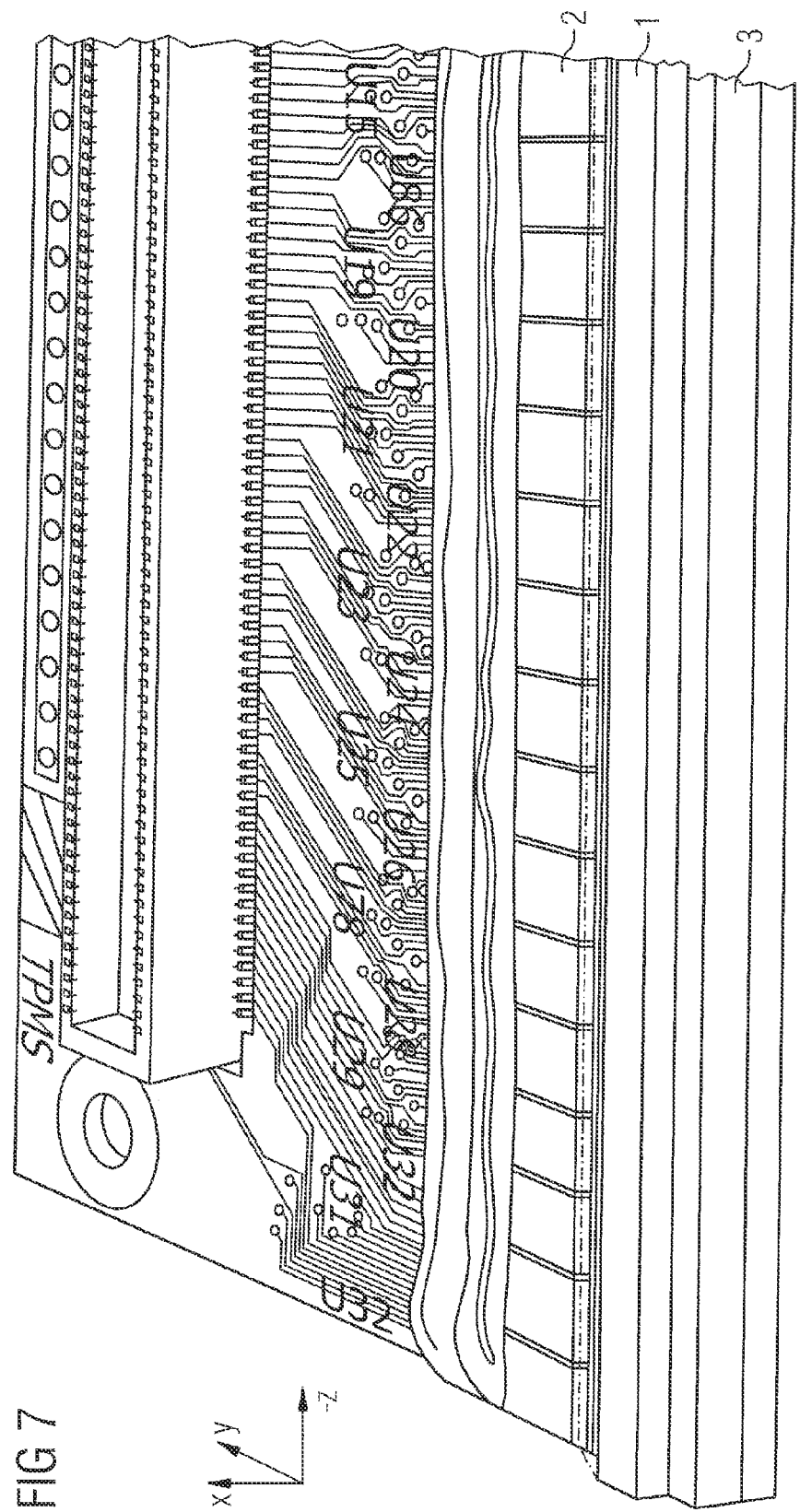
FIG. 7: a drawing of the design of a prototype of an X-ray detector in accordance with the present subject matter.

FIG. 7 shows a plan view of a corresponding X-ray detector in which the individual ASICs 2, each having 32 channels, the (first) X-ray sensor 1 and the X-ray absorber 3 can be seen.

What is claimed is:
1. An X-ray detector comprising:
a first X-ray sensor directly converting X-radiation (R) into electric charge carriers;
signal evaluation electronics electrically connected to the first X-ray sensor and including an integrated circuit;
an X-ray absorber, configured to protect the signal evaluation electronics; and a first sensor carrier configured and arranged for positioning the first X-ray sensor relative to the X-ray absorber, wherein, viewed in a direction of incidence (E) of the X-radiation, the signal evaluation electronics and the first sensor carrier are arranged behind the X-ray absorber and in an X-radiation shadow (S) of the X-ray absorber and wherein the first X-ray sensor is situated such that the first sensor carrier is arranged between the X-ray absorber and the signal evaluation electronics at least sectionally behind the X-ray absorber, but the first X-ray sensor is outside the X-radiation shadow (S) of the X-ray absorber; and wherein the X-ray detector comprises a further second X-ray sensor that converts the X-radiation (R) directly into electric charge carriers and that is electrically connected to the signal evaluation electronics; and a further second sensor carrier configured and arranged for positioning the second X-ray sensor relative to the X-ray absorber;

wherein, viewed in the direction of incidence (E) of the X-radiation (R), the second X-ray sensor is arranged behind the first X-ray sensor and is situated such that the second sensor carrier is arranged between the first sensor carrier and the signal evaluation electronics behind the X-ray absorber, but the second X-ray sensor is outside the X-radiation shadow (S) of the X-ray absorber.

2. The X-ray detector of claim 1, wherein the X-ray absorber, the first sensor carrier and the signal evaluation electronics are arranged together on a substrate, in particular a circuit board, in the aforesaid order viewed in the direction of incidence (E) of the X-radiation (R);

wherein a material of the first sensor carrier arranged in a direction (x), viewed perpendicular to this direction of incidence (E) and perpendicular to a plane (y, z) of the substrate, between the substrate and the first X-ray sensor has a thermal coefficient of expansion which lies between the thermal coefficient of expansion of a material of the substrate and that of a material of the first X-ray sensor and/or adapts the thermal expansion of the first X-ray sensor to that of the substrate; and/or wherein, viewed perpendicular to the direction of incidence (E) of the X-radiation (R) and perpendicular to the plane (y, z) of the substrate, the first sensor carrier has the same extent as the X-ray absorber and/or is positioned completely in the X-radiation shadow (S) of the X-ray absorber.

3. The X-ray detector in accordance with claim 1, wherein the second sensor carrier has the same extent as the X-ray absorber viewed perpendicular to the direction of incidence (E) of the X-radiation (R) and perpendicular to the plane (y, z) of the substrate; and/or wherein the first sensor earlier and/or the second sensor carrier is/are completely positioned in the X-radiation shadow (S) of the X-ray absorber; and/or wherein the material of the second sensor carrier arranged, viewed in the direction (x) perpendicular to this direction of incidence (E) and perpendicular to the plane (y, z) of the substrate, between the substrate and the second X-ray sensor has a thermal coefficient of expansion that lies between the thermal coefficient of expansion of the material of the substrate and that of the material of the second X-ray sensor and/or that adapts the thermal expansion of the second X-ray sensor to that of the substrate.

4. The X-ray detector of claim 1, wherein the first sensor carrier and/or the second sensor carrier is/are configured for providing an electric voltage supply to the first X-ray sensor and/or to the second X-ray sensor.

5. The X-ray detector of claim 1, comprising a beam stop provided with an opening, wherein the beam stop, viewed in the direction of incidence (E) of the X-radiation (R), is arranged before the first X-ray sensor or before the first X-ray sensor and the second X-ray sensor and that is aligned such that the first X-ray sensor or the first and the second X-ray sensor is/are not arranged in the X-radiation shadow (SB) of the wall of the beam stop, but rather behind the opening.

6. The X-ray detector of claim 1, wherein the first X-ray sensor and/or the second X-ray sensor, include a plurality of individual pixels viewed in a direction (z) perpendicular to a direction of incidence of the X-radiation (R) and in a plane (y, z) of the substrate for the spatially resolved detection of the X-radiation (R), said individual pixels being electrically connected to the signal evaluation electronics for transmitting sensor signals to the signal evaluation electronics via bond wires and/or via flip-chip contacts.

7. The X-ray detector of claim 1, wherein the first X-ray sensor and the second X-ray sensor are configured to be supplied with electric voltage separately and independently of each other.

8. An X-ray detector comprising:

a substrate;

a first X-ray sensor and a second X-ray sensor that both respectively convert X-radiation (R) directly into electric charge carriers and that are both arranged on a first side of the substrate;

signal evaluation electronics that are electrically connected to both X-ray sensors, that include or are formed as one or more integrated circuits and that are arranged on the second side of the substrate disposed opposite the first side; and an X-ray absorber that is formed for the protection of the signal evaluation electronics, that is arranged on the second side of the substrate in front of the signal evaluation electronics viewed in the direction of incidence (E) of the X-radiation (R) and that is positioned such that the signal evaluation electronics are arranged in the X-radiation shadow (S) of the X-ray absorber; and wherein the two X-ray sensors are configured for absorbing different spectral portions of the X-radiation (R); and both X-ray sensors include a line sensor structure and are positioned after each other viewed in the direction of incidence (E) of the X-radiation (R) such that pixels of the first X-ray sensor projected in parallel in this direction of incidence (E) come to lie exactly on pixels of the second X-ray sensor so that identical spatial information is capable of being acquired with the two X-ray sensors.

9. The X-ray detector of claim 8, wherein the electrical connection of the signal evaluation electronics to the first X-ray sensor and/or to the second X-ray sensor serving the transmission of the sensor signals to the signal evaluation electronics is configured using one or more electrically conductive vias leading through the substrate.

10. The X-ray detector of claim 8, wherein the first X-ray sensor is configured for absorbing a lower energy portion of the X-ray radiation (R) and the second X-ray sensor is configured for absorbing a higher energy portion of the X-radiation (R) and/or containing semiconductor materials of different atomic numbers; and/or wherein one of the two X-ray sensors contains Si and the other of the two X-ray sensors contains GaAs.

11. The X-ray detector of claim 8, configured in a plurality of the X-ray detectors that are stacked over one another with their substrate planes lying in parallel such that the line sensor structures of their first X-ray sensors or their first and second X-ray sensors in the plane (x, z) viewed perpendicular to the direction of incidence (E) of the X-radiation (R) form (a) two-dimensional area sensor structure(s) in the form of (a) two-dimensional pixel array(s).

* * * * *